United States Patent
Huang et al.

(10) Patent No.: US 10,447,488 B2
(45) Date of Patent: Oct. 15, 2019

(54) DEVICE AND METHOD FOR DETECTING POWERED DEVICES CONNECTED TO A POWER SOURCE EQUIPMENT IN A POWER OVER ETHERNET SYSTEM

(71) Applicant: IC Plus Corp., Hsinchu (TW)

(72) Inventors: Philip Huang, Hsinchu (TW); Chef Hsiao, Hsinchu (TW); Pai-Yi Chiu, Hsinchu (TW)

(73) Assignee: IC Plus Corp., Hsinchu (TW)

( * ) Notice: Subject to any disclaimer, the term of this patent is extended or adjusted under 35 U.S.C. 154(b) by 413 days.

(21) Appl. No.: 15/467,229

(22) Filed: Mar. 23, 2017

(65) Prior Publication Data

US 2018/0091319 A1  Mar. 29, 2018

(30) Foreign Application Priority Data

Sep. 23, 2016  (TW) .............................. 105130765 A

(51) Int. Cl.
  *G01R 31/04*  (2006.01)
  *H04L 12/10*  (2006.01)
  *G01R 31/44*  (2006.01)

(52) U.S. Cl.
  CPC .............. *H04L 12/10* (2013.01); *G01R 31/04* (2013.01); *G01R 31/44* (2013.01)

(58) Field of Classification Search
  USPC ............................................................. 307/1
  See application file for complete search history.

(56) References Cited

U.S. PATENT DOCUMENTS

| 2006/0164062 A1* | 7/2006 | Stineman, Jr. .......... H04L 12/10 324/76.11 |
| 2017/0250828 A1* | 8/2017 | Buchanan ............... H04L 12/10 |

* cited by examiner

*Primary Examiner* — Rexford N Barnie
*Assistant Examiner* — Xuan Ly
(74) *Attorney, Agent, or Firm* — Muncy, Geissler, Olds & Lowe, P.C.

(57) ABSTRACT

The present invention relates to device and method for detecting powered devices connected to a power source equipment in a Power over Ethernet system that provides multiple signal/power channels. A series of inspection signals including one discriminative signal is applied to the respective channels and response signals to the discriminative signal and other detection signals are compared in order to determine whether multiple channels are connected to one single powered device.

29 Claims, 8 Drawing Sheets

DEVICE AND METHOD FOR DETECTING POWERED DEVICES CONNECTED TO A POWER SOURCE EQUIPMENT IN A POWER OVER ETHERNET SYSTEM

CROSS REFERENCE TO RELATED APPLICATIONS

This non-provisional application claims priority under 35 U.S.C. § 119(a) on Patent Application No. 105130765 filed in Taiwan on 2016 Sep. 23, the entire contents of which are hereby incorporated by reference.

FIELD OF INVENTION

The present invention relates to a circuit and a method for detecting a connection configuration of powered devices in a Power over Ethernet (PoE) system, in particular in a PoE system having a plurality of power supply channels.

PRIOR ART

Power over Ethernet (PoE) system has found widespread applications in many areas. For example, IEEE has released two standards that relate to PoE-IEEE 802.3af in 2003 and IEEE 802.3at in 2009. These standards are adopted by many applications. In this disclosure, these standards relevant to the PoE will be referred to as the "POE Standard" hereinafter. PoE technology allows supplying electric power through Ethernet to devices such as Internet phone, wireless stations, network cameras, hubs, and even computers without the need of extra power outlet. Combining data transmission and power supply, PoE technology can reduce the cost and complexity of the overall network computing system.

In a power over Ethernet (PoE) system, the electric power is provided by the power source equipment (PSE) via Ethernet data cable to the powered device (PD). The power source equipment may be an Ethernet switch, a router, or other network switching and midspan devices. In the PoE system, a powered device is connected to the network and configured to obtain or request power from the power source equipment over the network.

In a PoE system, the power source equipment may connect to multiple powered devices through their network cables, but may also connect to devices that will not or cannot obtain power from the power source equipment. In a real application, the powered device may include devices that are in compliance with the POE Standard, and devices that are compatible with the POE Standard. The POE Standard provides that, before a power source equipment may provide power to a powered device, the power source equipment must determine whether the particular powered device is in compliance with the POE Standard, i.e., a qualified powered device. If yes, the power source equipment will provide power to the suitable device.

Under the POE Standard, when carrying out said inspection, the power source equipment provides a signal to the connecting signal/power channel of a target device, and detects the response signal from the connecting signal/power channel. If the response signal indicates a signature resistance ranging from 19 k to 26.5 k ohms, then the device is determined to be a powered device in compliance with the POE Standard, i.e., a qualified powered device suitable for supplying power. The POE Standard also specifies that the voltage of the detection signals provided by the power source equipment should be between about 2.8 V and 10 V, the current should be less than about 5 mA, and the voltage difference of the detection signals should be more than 1 V.

During the inspection, a typical method is for the power source equipment to apply a voltage or current to the particular signal/power channel, and then to measure the response signal from the target device after a predetermined period. The signature resistance is calculated based on the current/voltage relationship from the two signals. If a current is applied, the current is normally in the range of 150 μA to 400 μA, and the voltage of the signal/power channel is measured to calculate the value of the signature resistance. In this case, a target device in compliance with the POE Standard will cause the power sourcing device to detect an about 2.8 V to 10 V voltage drop in the signal/power channel.

Alternatively, if the testing signal is a voltage signal, the voltage is generally between about 2.8V to 10V, and the detected current value shall be between about 125 uA to 400 uA.

Under the IEEE802.3af standard, for a signal/power channel (cable) formed by two pairs of twisted pairs, the power supply by a power source equipment shall not exceed 15.4 watts. This type of power source equipment is referred to as a Type 1 PSE and devices suitable for this Type 1 PSE are also known as low power consumption PSE/PD. In addition, the IEEE 802.3at standard specifies that power supplied by a power source equipment to a signal/power channel (cable) formed by two pairs of twisted pairs should not exceed than 30 watts. This type of power source equipment is referred to as a Type 2 PSE and devices suitable for this Type II PSE are also referred to as medium power consumption PSE/PD. In addition to the low and medium power consuming PSE/PDs described above, there are other types of PSEs and PDs that can supply/receive higher powers. This type of PSE/PDs are called high power consumption PSE/PDs.

Category 5e (CAT 5e) and Category 6 (CAT 6) cables, as defined by the ANSI/TIA/EIA-568-A standards, provide cables consisting of two or four of twisted pairs, suitable for carrying a power higher than that of the first type or the second type. Therefore, if the power source equipment of the first type or the second type mentioned above is connected with a cable using four twisted pairs, higher power can be provided to the powered device, without compromising the safety requirements specified in these two cable standards.

In order to provide higher power to the powered device, the power source equipment of the above system supplies power to a powered device via two signal/power channels, each consisting of two twisted pairs, respectively. In such a connection, a configuration may be 1) one single powered device connected to two channels simultaneously (all of the four pairs of twisted pair, FIG. 1) to receive a higher power supply; 2) two powered devices each connected to one channel (two of twisted pair, FIG. 2) to receive power from one channel, respectively; and 3) one powered device connected to one of the two channels (two of the four pairs) to receive power from one of the channels.

Due to the diversified configurations in the connection of the powered devices and the power source equipment, the power source equipment of the PoE system must be able to correctly detect the multiple power channels and the multiple powered devices, in order to supply power correctly.

For example, in the case of FIG. 1, when the power source equipment 100 sends a detection signal to the twisted pairs D1 and D2 of the first channel, a response signal will be received by the power source equipment 100, because a powered device 20 as shown in FIG. 1 is connected to the power source equipment 100. The response signal will be used to calculate an impedance value. Since the impedance value falls in the effective range, the powered device 20 is determined suitable for supplying power supply and power is supplied thereto. However, when the power source equipment 100 sends a detection signal to the twisted pairs D3 and D4 of the second channel, because the powered device 20 is also connected to the second channel, the impedance value of the detected response signal will exceed the effective range, resulting in failure of the detection. As a result, the power source equipment 100 will not supply power to the second channel, because detection in the second channel fails. In such a case, however, the powered device 20 is usually a high power consumption device. The power source equipment 100 provides power only to a single channel and the supplied power will not meet the needs of the powered device 20, resulting in failure of the dual-channel architecture to provide higher power using the two channels.

U.S. Pat. No. 8,305,906 B2 discloses a method for detecting powered devices in a PoE system that detects whether or not a two-channel signal cable having four twisted pairs is connected to the same powered device. The method comprises generating a detection signal for one channel and detecting a response signal from the other channel. When the response signal indicates that the target device connected to this channel is not a qualified powered device, the power source equipment determines that both channels are connected to one powered device.

U.S. Pat. No. 9,281,691 B2 discloses a device for detecting whether or not, in a power source equipment of a PoE system, a dual-channel signal cable having four twisted pairs is connected to the same powered device. The detection used includes sending a detection signal to both channels at the same time. When the response signal from one channel indicates that a qualified powered device is connected to that channel, the impotence value of response signals from the two channels is evaluated. If they fall into a specific range, it is determined that the two channels are connected to the same powered device and the power source equipment simultaneously supplies power to the two channels.

SUMMARY OF THE INVENTION

The objective of the present invention is to provide a novel device for detecting powered devices connected to a power source equipment in a Power over Ethernet system. The invented device detects powered devices connected to signal cables of multiple channels and determines the configurations in the connection of the powered device and the power source equipment.

It is also an object of the present invention to provide a novel device for detecting powered devices connected to a power source equipment in a Power over Ethernet system that can correctly detect the connection arrangement of the powered device within a short overall detection time.

The object of the present invention is also to provide an method for detecting powered devices connected to a power source equipment in a Power over Ethernet system having the above-described advantages.

The present invention provides a novel device for detecting powered devices connected to a power source equipment in a Power over Ethernet system. The detection device may be installed in the power source equipment (PSE) in a Power over Ethernet (POE) system. The power source equipment comprises at least four pairs of twisted pairs, wherein two of the twisted pairs form a single signal/power channel. In various embodiments of the present invention, each signal/power channel is connected to a node, which may be a signal line connector, preferably an Ethernet signal line connector, to be connected by a powered device in order to supply electric power to the powered device. The detection device connects the two signal/power channels and is configured to apply to each channel a series of detection signals including a plurality of basic detection signals and at least one discriminative signal; wherein a detection signal series A applied to the first channel and a detection signal series B applied to the second channel have the same number and level of the basic detection signals and the same number but different levels of discriminative signals.

The detection device is further configured to detect a response signal series A from the first channel and a response signal series B from the second channel after a predetermined time following the application of the detection signal series and to determine whether the first channel and the second channel are connected to the same powered device, according to response signals in the response signal series A and B in response to the discriminative signals, respectively. The detection device is further configured to, if a result of the preceding determination is negative, calculate a resistance value according to the response signal series A and the response signal series B and to determine whether the two channels are connected to two powered devices or are connected to no powered device, or only one channel is connected to one powered device. The power source equipment is configured to supply power to a powered device determined to be connected with the power source equipment.

In a preferred embodiment of the present invention, the basic detection signals of the respective detection signal series include in sequence a first detection signal V1a, V1b, a second detection signal V2a, V2b, a third detection signal V3a, V3b and a fourth Detection signals V4a, V4b and the discriminative signal includes a fifth detection signal V5a, V5b, wherein in the detection signal series A applied to the first channel the levels of the first and third detection signals V1a and V3a are substantially the same and the levels of the second and fourth detection signals V2a and V4a are substantially the same; in the detection signal series B applied to the second channel, the levels of the first and third detection signals V1b and V3b are substantially the same and the levels of the second and fourth detection signals V2b and V4b are substantially the same. In one detection signal series, the level of the fifth detection signal V5a is substantially the same as that of the first and third detection signals V1a and V3a or V1b and V3b, or as that of the second and fourth detection signals V2a and V4a or V2b and V4b and in the other detection signal series the level of the fifth detection signal is the contrary.

In a preferred embodiment of the present invention, the discriminative signal is generated after the basic detection signals. In other embodiments, however, the discriminative signal is generated before the basic detection signals, or at least a part thereof. In still other examples of the invention, the detection signal series further comprises a sixth detection signal V6a, V6b for generating a reference response signal.

In a preferred embodiment of the present invention, the response signal series detected from the first and second channels, respectively, each includes in sequence a first response signal I1a, I1b responsive to the first detection signal V1a, V1b, a second response signals I2a, I2b responsive to the second detection signal V2a, V2b, a third response signal I3a, I3b responsive to the third detection signal V3a, V3b, a fourth response signal I4a, I4b responsive to the fourth detection signal V4a, V4b, and a fifth response signal I5a, I5b responsive to the fifth detection signal V5a, V5b. If a sixth detection signal V6a, V6b is present, the response signal series further includes a sixth response signal I6a, I6b as a reference response signal.

In the preferred embodiment of the present invention, the detection signals are a voltage signal and the response signals are a current signal, while other embodiments, the detection signals are a current signal and the response signals are a voltage signal. In such embodiments, the determination method comprises the following steps:

determining the two channels are connected to one same powered device, if I5a=I1a+I1b and I5b=0; otherwise, determining the two channel are respectively connected to two powered devices, if Rdet1a=Rdet2a and Rdet1b=Rdet2b, determining the first channel is connected to one powered device and the second channel is not connected to a powered device, if Rdet1a=Rdet2a and Rdet1b≠Rdet2b, and determining the second channel is connected to one powered device and the first channel is not connected to a powered device, if Rdet1a≠Rdet2a and Rdet1b=Rdet2b; otherwise, determining no powered device is connected to the first or the second channel; wherein Rdet1a=(V1a−V2a)/(I1a−I2a), Rdet2a=(V3a−V4a)/(I3a−I4a), Rdet1b=(V1b−V2b)/(I1b−I2b) and Rdet2b=(V3b−V4b)/(I3b−I4b).

In a particular embodiment of the invention, the duration of the fourth detection signal is the sum of the duration of the second detection signal and an extension time. The extension time is 0.2 to 1.5 times, preferably 0.5 to 1.0 times, of the duration of the second detection signal.

In some embodiments of the present invention, the detection device is configured to determine a channel is not connected to any powered device and no power shall be supplied thereto, if a Rdet1a, Rdet2a, Rdet1b, and Rdet2b corresponding to the channel exceeds a predetermined value range.

The detection device of the present invention may further include a mechanism for determining whether or not a powered device connected to a particular channel is suitable for supplying power. A powered suitable for supplying power is preferably an powered device complying with the IEEE 802.3af standard and/or the IEEE 802.3at standard.

These and above objectives and advantages of the present invention will become more apparent from the following detailed description taken in conjunction with the accompanying drawings.

SCHEMATIC SIMPLE EXPLANATION

Figure 1:
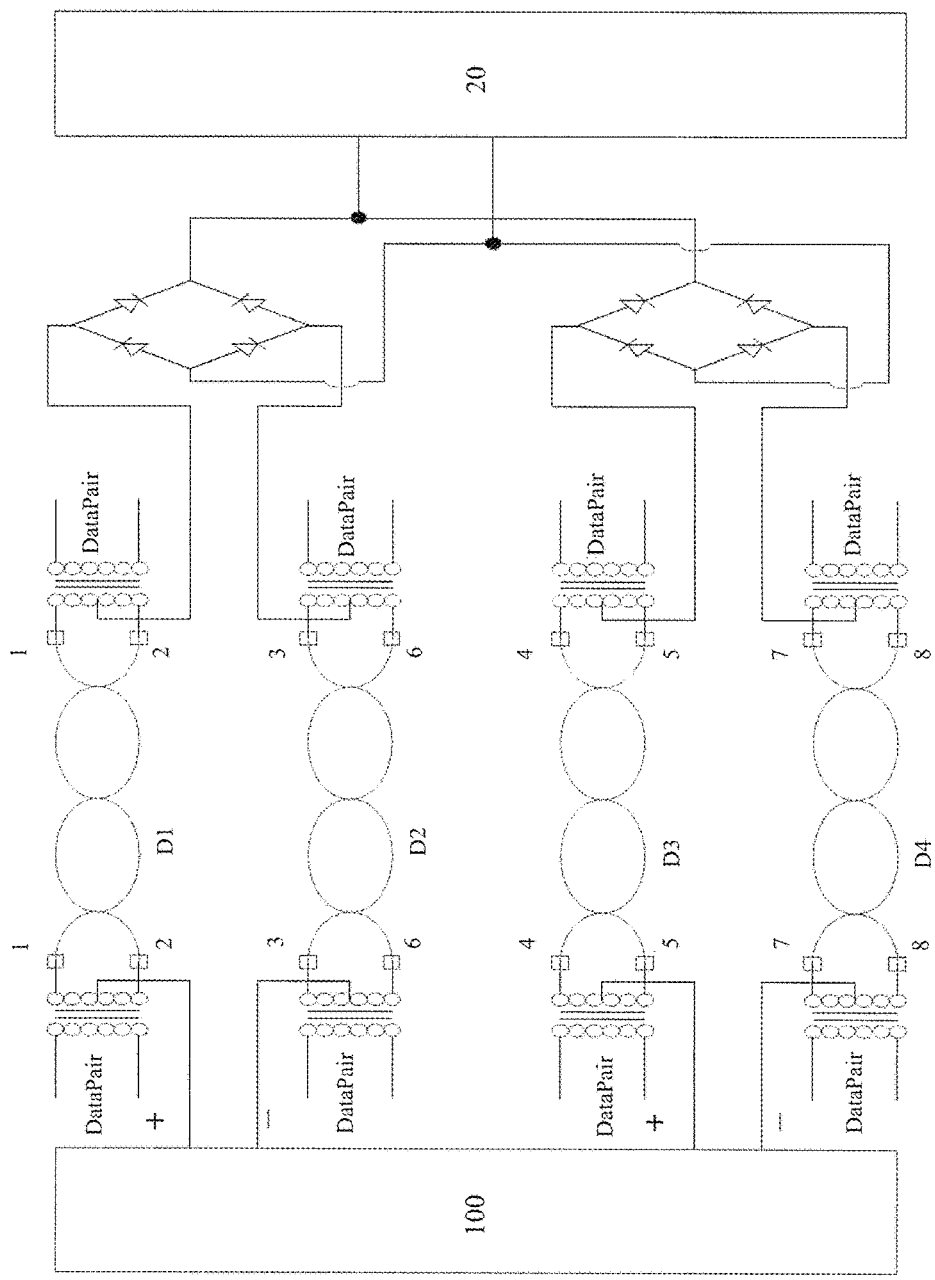
FIG. 1 shows the schematic diagram of a power source equipment for a Power-over-Ethernet system according to the invention, wherein one powered device connects to the power source equipment through two channels simultaneously.
Figure 3A:
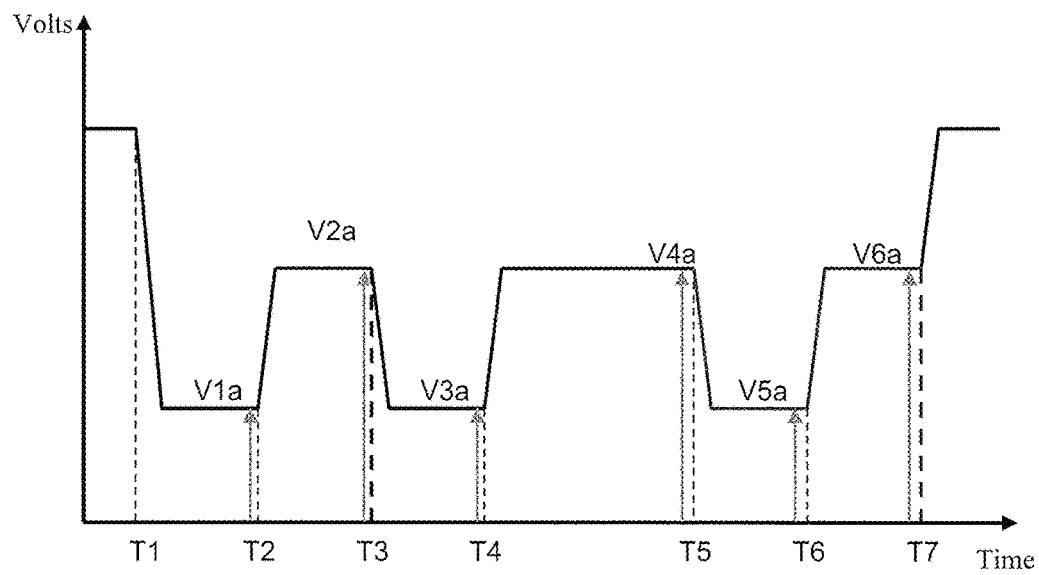
FIGS. 3a and 3b show the waveform of detection signal used in one embodiment of the invented method for detecting powered devices connected to a power source equipment in a Power over Ethernet system.
Figure 3B:
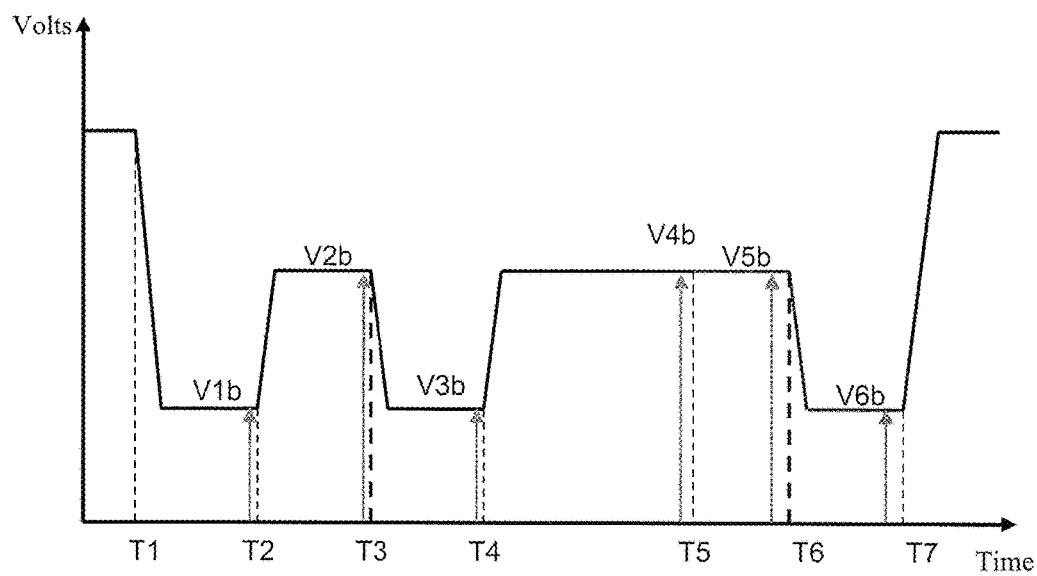
Figure 4A:
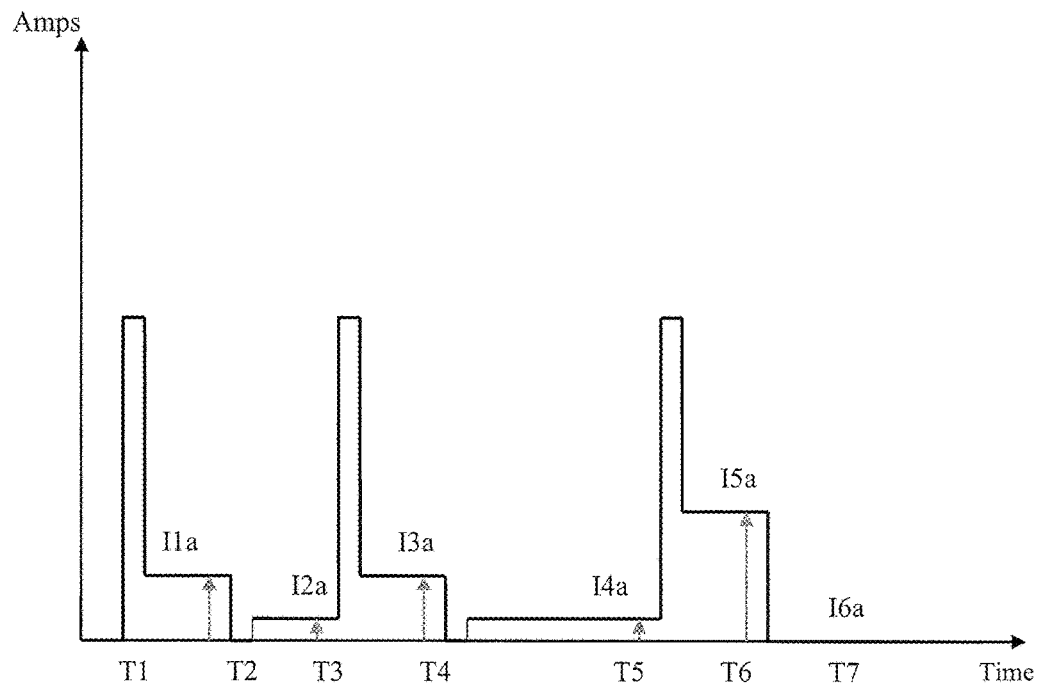
Figure 4B:
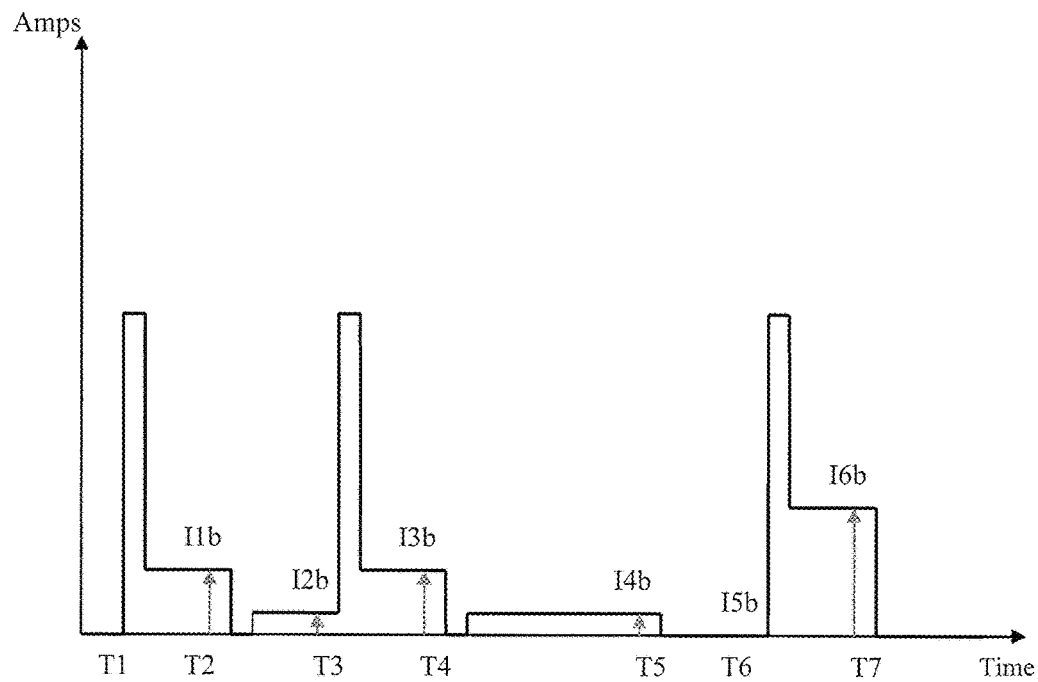

FIGS. 4a and 4b respectively show the waveform of response signals in response to detection signals of FIGS. 3a and 3b, obtained in the connection configuration of FIG. 1.

Figure 2:
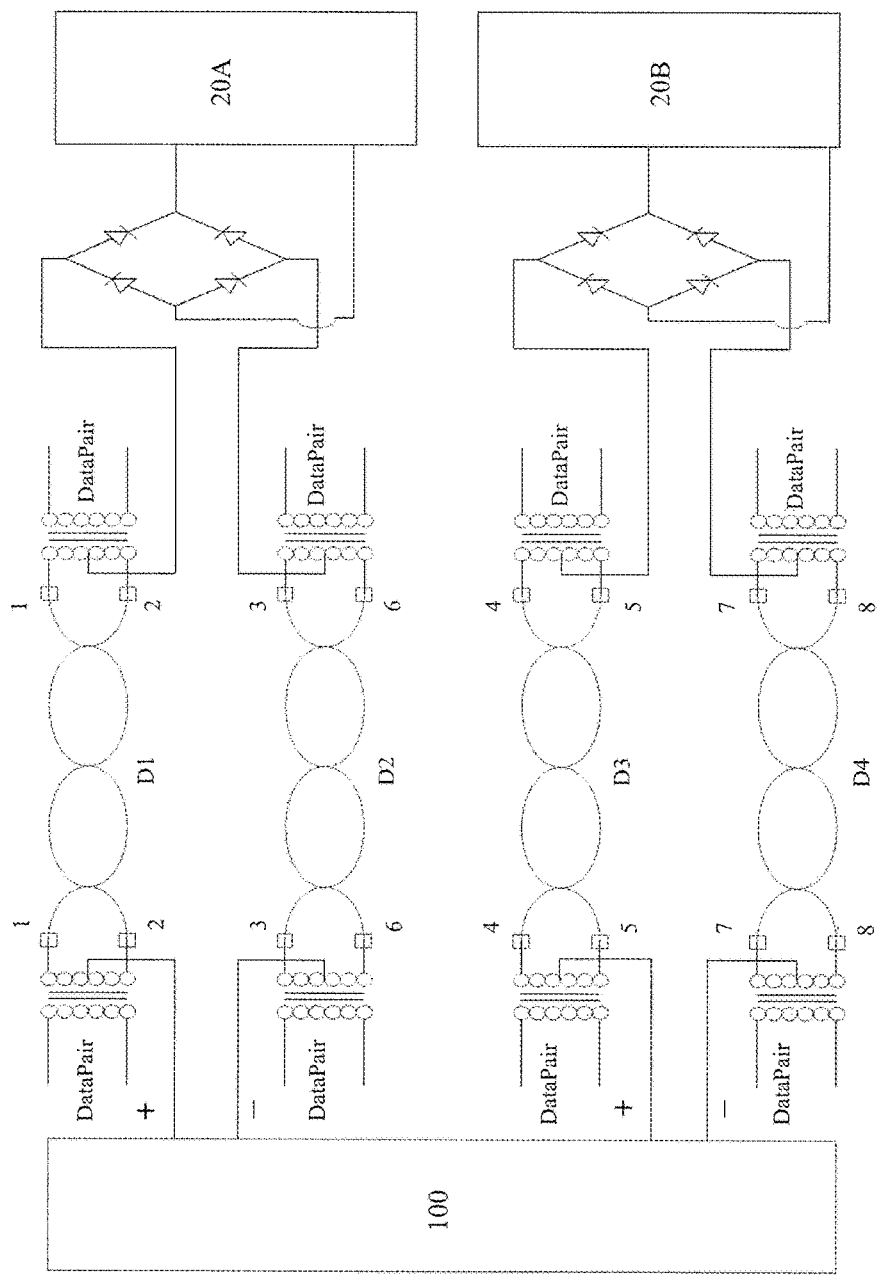
FIG. 2 shows the schematic diagram of a power source equipment for a Power-over-Ethernet system according to the invention, wherein two powered devices connect to the power source equipment through two channels respectively.
Figure 5A:
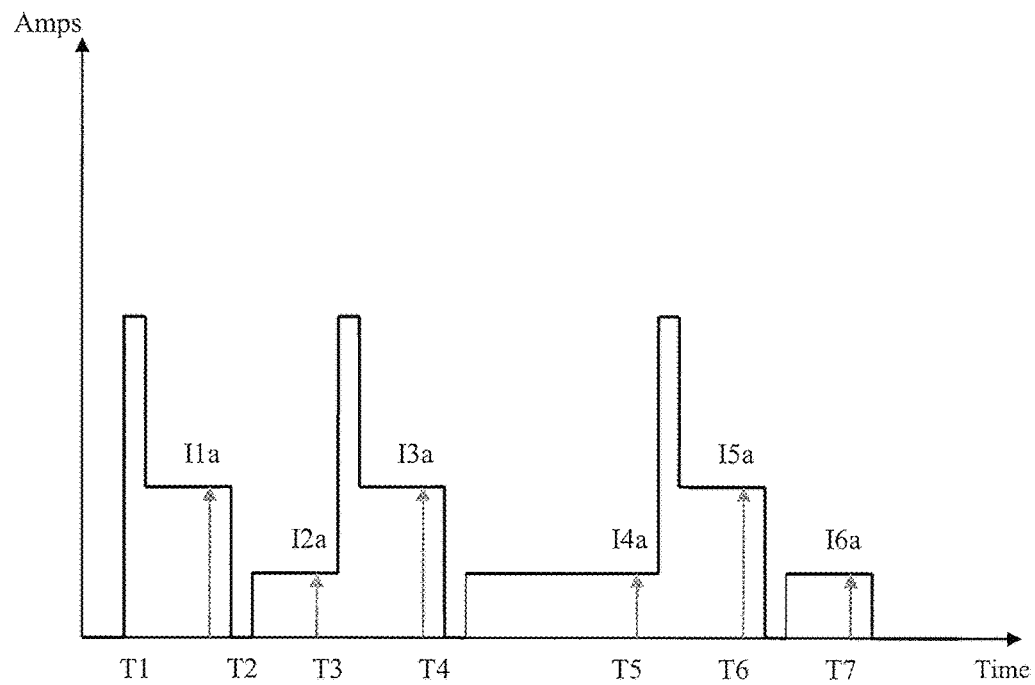
Figure 5B:
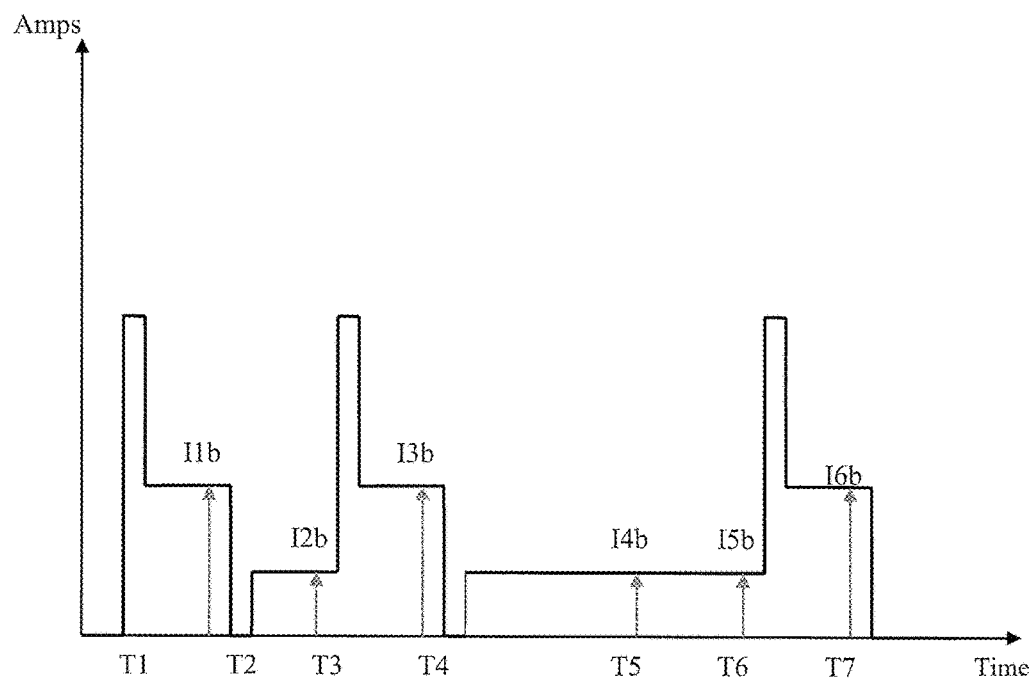

FIGS. 5a and 5b respectively show the waveform of response signals in response to detection signals of FIGS. 3a and 3b, obtained in the connection configuration of FIG. 2.

Figure 6A:
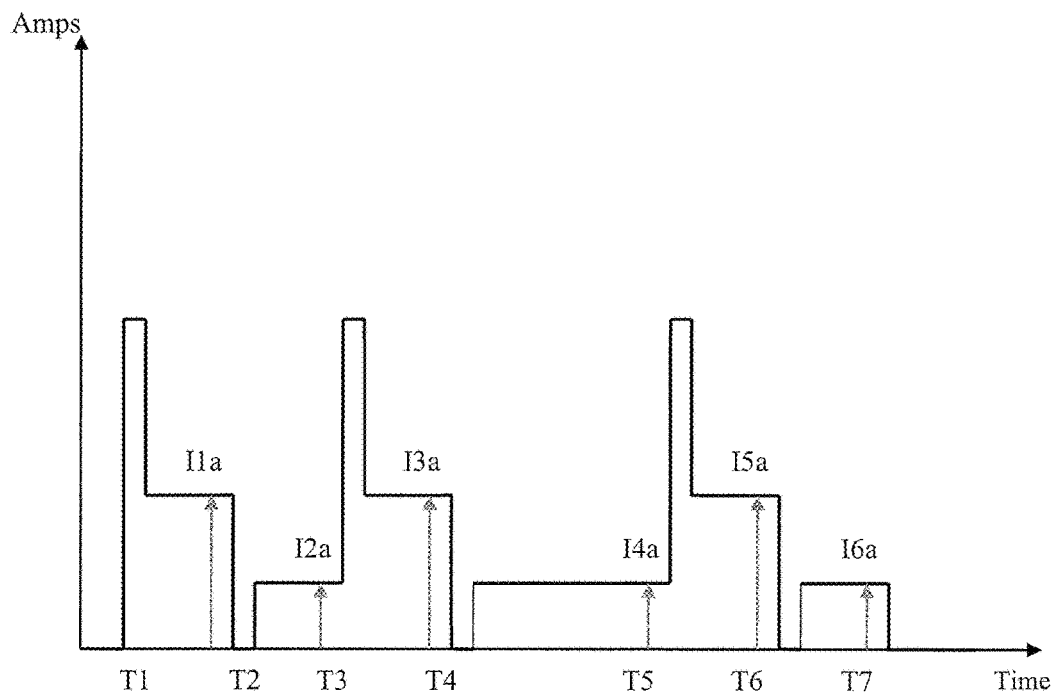
Figure 6B:
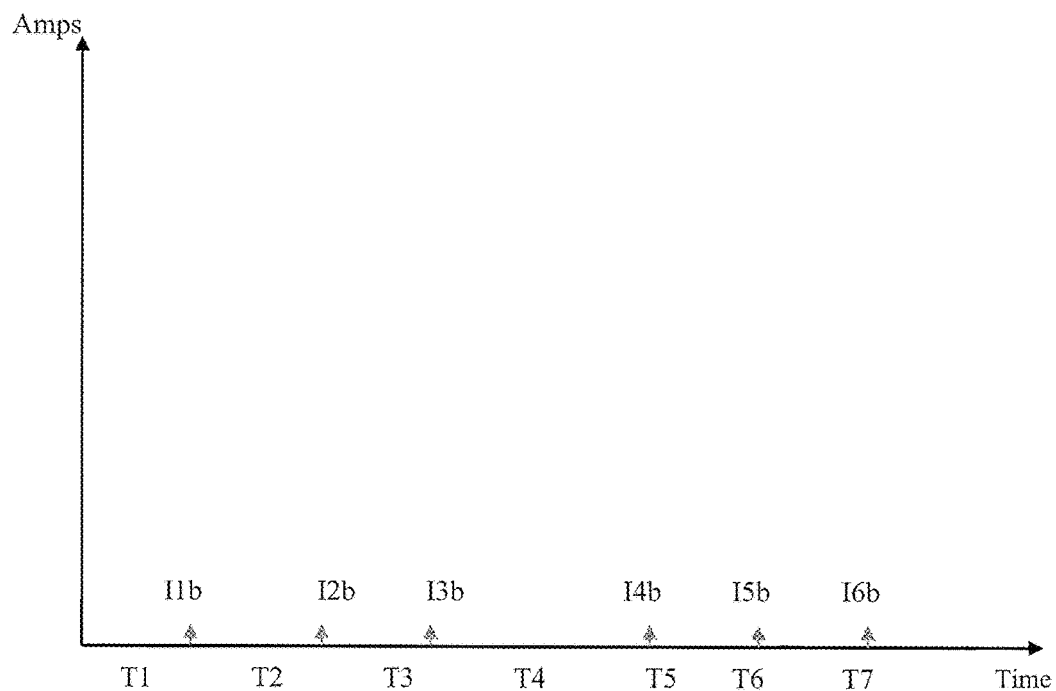

FIGS. 6a and 6b respectively show the waveform of response signals in response to detection signals of FIGS. 3a and 3b, obtained in another connection configuration according to this invention.

Figure 7:
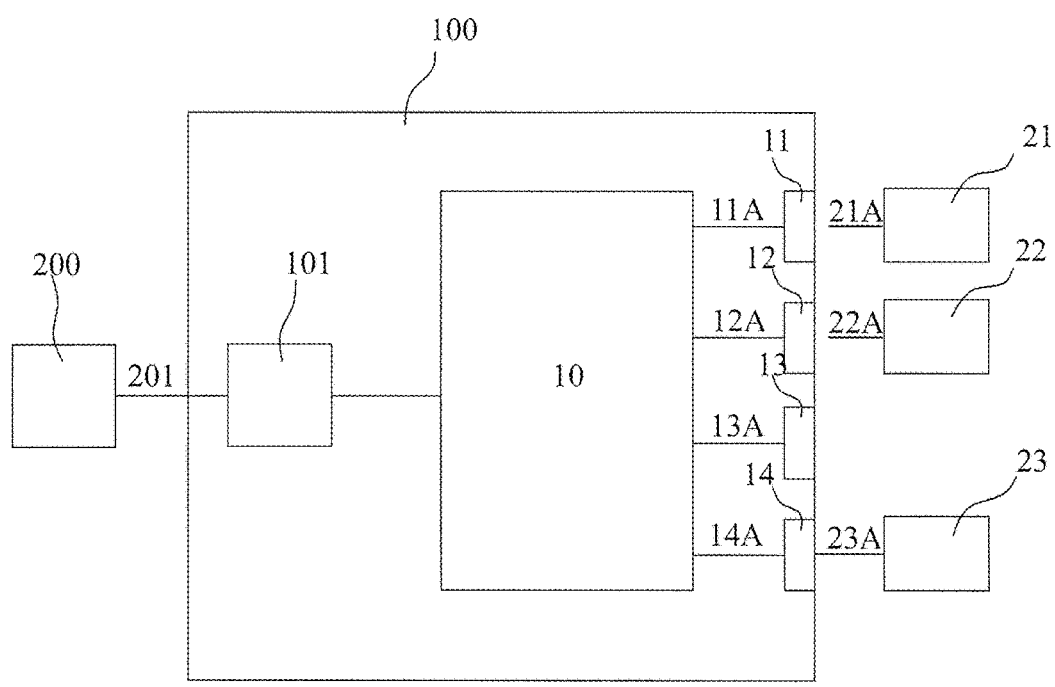

FIG. 7 is a block diagram of a device for detecting powered devices connected to a power source equipment in a Power over Ethernet system according to an embodiment of the present invention.

Figure 8:
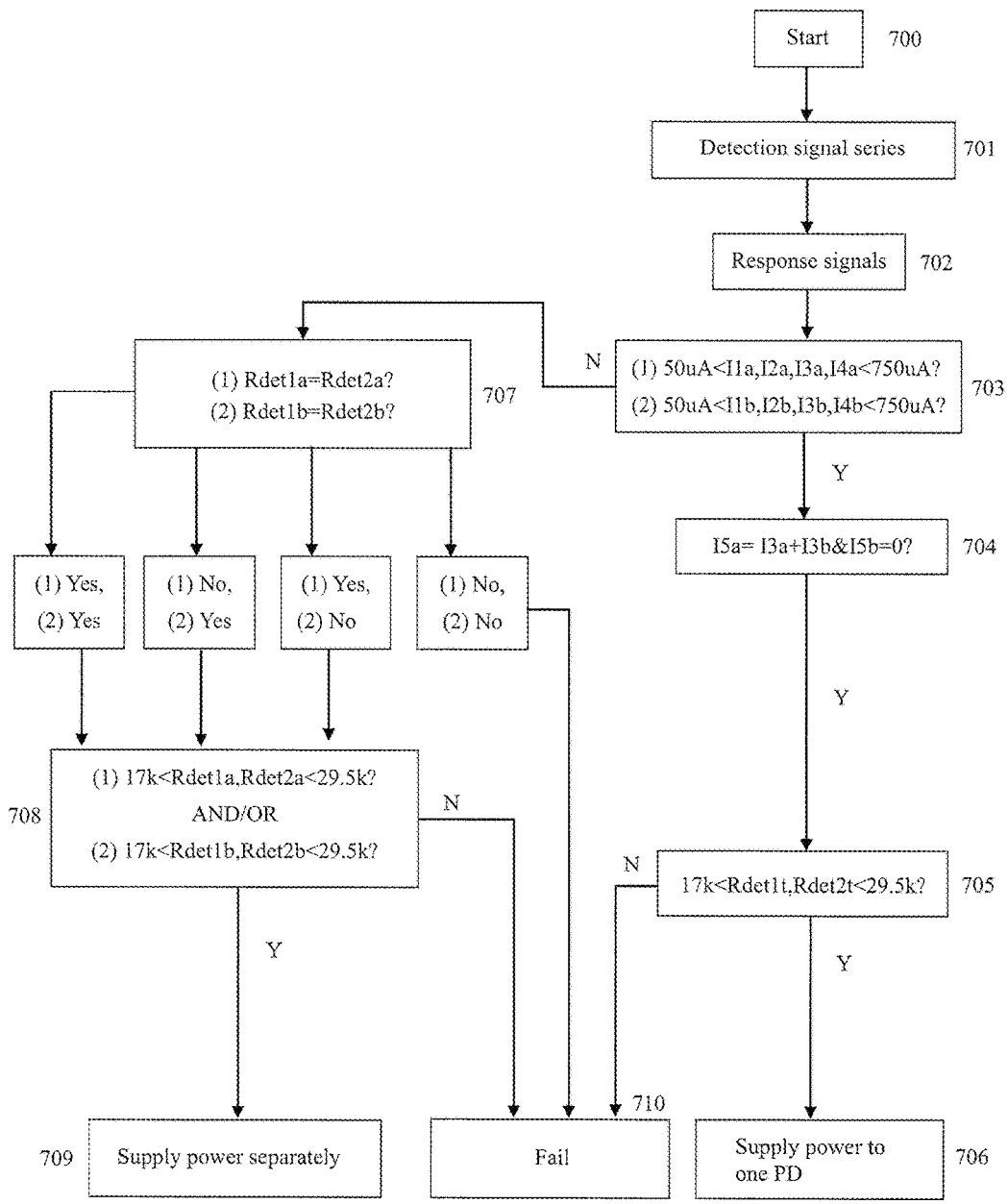

FIG. 8 is a flow chart showing a method for detecting powered devices connected to a power source equipment in a Power over Ethernet system according to an embodiment of the present invention.

EMBODIMENT

The present invention provides a novel device and method for detecting powered devices connected to a power source equipment in a Power over Ethernet system for use in an Ethernet power supply system having a plurality of signal/power channels. The invented device and method detect powered devices that may be connected to the power source equipment of the system and determine the connection configuration of the powered devices and the power source equipment. To be specific, the invented method and device detect and determine:

1. Whether each of the plural signal/power channels of the powered source equipment is connected by a powered device.

2. Whether a powered device in connection with the signal/power channel is suitable for supplying power.

3. Whether a plurality of powered source equipment of the power supply is connected to the same powered device.

In most conventional Power over Ethernet systems, the powered source equipment is capable of detecting whether or not a signal/power channel is in connection with a powered device and whether the connected powered device is suitable for supplying power. However, the power source equipment of the conventional Ethernet power supply system provides only one power supply channel, that is, a signal and/or power channel composed of two pairs of twisted pairs. A detection device for powered device used in the conventional powered source equipment cannot correctly detect and determine the connection configuration of powered devices in a multichannel powered source equipment.

FIG. 1 shows a power source equipment 100 for a Power-over-Ethernet system according to an embodiment of the present invention, wherein one powered device 200 connects to the power source equipment 100 through two channels D1/D2 and D3/D4, simultaneously FIG. 2 shows the power source equipment 100 connected with two powered devices through two channels D1/D2 and D3/D4, respectively. In addition to the connection configurations shown in FIGS. 1 and 2, the configuration may also be one of the followings: In the two channels one is connected to a powered device, while the other is not connected to any powered device, and no channel is connected to any powered device or any qualified powered device.

The present invention provides a novel device and method for detecting powered devices and determining a connection configuration of the powered devices and a power source equipment connected thereto. When detection, the invented inspection device provides a detection signal to a plurality of signal/power channels, preferably two channels, respectively. The detection signal includes a discriminative signal.

More specifically, the detection signal is a series of signals and includes a plurality of basic detection signals and at least one discriminative signal; wherein a detection signal series A applied to the first channel and a detection signal series B applied to the second channel have the same number of the basic detection signals with the same levels and the same number of the discriminative signal with different level.

For example, if the power source equipment provides two channels, each including two pairs of twisted pairs, the detection signal series applied to the two channels by the detection device will include a plurality of basic detection signals and a discriminative signal, respectively. The basic detection signals include in sequence a first detection signal V1a, V1b, a second detection signal V2a, V2b, a third detection signal V3a, V3b and a fourth detection signal V4a, V4b; and the discriminative signal includes a fifth detection signals V5a and V5b. The detection signal series may also include a sixth detection signal V6a, V6b for generating a reference response signal. In the detection signal series A applied to the first pair of twisted pairs, the levels of the first and third detection signals V1a and V3a are substantially the same and so are the levels of the second and fourth detection signals V2a and V4a. In the detection signal series B applied to the second pair of twisted pairs, the levels of the first and third detection signals V1b and V3b are substantially the same and so are the levels of second and fourth detection signals V2b and V4b. In the embodiment shown in FIG. 3a and FIG. 3b, one fifth detection signal V5a has the same level as the first and third detection signals V1a, V3a, V1b, V3b or the second and fourth detection signals V2a, V4a, V2b, V4b, and the other fifth detection signal V5b is opposite. The arrangements described above are adopted, due to they are simple and require no additional levels of the detection signals and are not any technical limitation. In practice, the level of a fifth detection signal V5a can be any, as long as it is sufficient to discriminate the level of another fifth detection signal V5b, so to provide useful information to the detection device for its determination. The sixth detection signals V6a, V6b are preferably different in level from the signal level immediately preceding or succeeding thereto.

The discriminative signal shown in this figure is generated after the basic detection signal. However, in other embodiments of the invention, the discriminative signal is generated before the basic detection signal, or at least a part thereof.

FIGS. 3a and 3b respectively show the waveforms of the detection signals used in the above-described embodiment of the invented method for detecting powered devices connected to a power source equipment in a Power over Ethernet system. In the detection signals shown in the figure, V1a=V1b=V3a=V3b=V5a=V6b=−8V and V2a=V2b=V4a=V4b=V6a=V5b=−4V. The period of the respective fourth detection signals V4a and V4b is equal to the sum of the period of the second detection signals V2a and V2b and an extension time. Therefore, the detection device samples the response signal after a time equal to the extension time. In practice, the extension time may be 0.2 to 1.5 times, preferably 0.5 to 1.0 times the period of the second detection signal. Such an arrangement lets the detection device to obtain the related response signal after an extension time, i.e., to obtain the response signal after the system is in a stable status. Failures in detection may thus be avoided or reduced.

According to the present invention, the detection device detects a response signal in each channel at a predetermined time after the detection signal series is applied. In the preferred embodiments of the present invention, the detection signal is a voltage signal and the response signal is a current signal, while in other embodiments, the detection signal is a current signal and the response signal is a voltage signal.

In a preferred embodiment of the present invention, the response signals of the respective channels also comprise a series of signals and include a first response signal I1a, I1b responding to the first detection signal V1a, V1b, a second detection signal I1a, I2b responding to the second detection signal V2a and V2b, a third response signal I1a, I3b responding to the third detection signal V1a, V3b, a fourth response signal I4a, 4b responding to the fourth detection signal V4a, V4b, and a fifth response signal I5a, I5b responding to the fifth detection signal V5a, V5b. If the detection signal series includes a sixth detection signal V6a, V6b, then the response signal series also includes a sixth response signal I6a, I6b. In each response signal series the response signals are in a sequence corresponding to the sequence of the detection signals in the detection signal series. If the period of the fourth detection signals V4a and V4b includes an extended time as described above, the detection device samples the response signal after a time equal to the extension time following the predetermined time.

Two signal/power channels with different connection configurations with or without powered devices are prepared and subjected to computer simulation with the detection signals of FIGS. 3a, 3b. Results of the simulations are as follows:

FIGS. 4a and 4b respectively show waveforms of the resulting response signal series for the two channels, in the connection configuration of FIG. 1, tested with the detection signals of FIGS. 3a and 3b. As shown in the figures, the two channels D1/D2 and D3/D4 are connected to the same powered device 20. The current values of the response signals are measured after a series of detection signals with a voltage of −4V or −8V are applied. Because the two channels are connected to the same powered device, the current shunts and the measured response signals have a level about half of the level of the measured response signals, when each channel is connected to only one powered device (c.f. FIG. 5a, 5b and FIG. 6a, 6b). The discriminative signal V5a applied to the first channel (FIG. 4a) is −8 V, or any other voltage value that can permeate the diode in the circuit, so that a response signal I5a of, for example, 320 uA is measured at time point T6. On the other hand, in the second channel (FIG. 4b) the discriminative signal V5b applied thereto is at −4V, or any level not enough to make the diode in the circuit permeable, so that the line remains OFF, and therefore at time point T6 a response signal I5b of 0 A is measured. Because the current does shunt, the current value of the response signal is about twice the level of a response signal with the same level. In addition, if a sixth detection signal is included, the reference detection signal V6a, V6b has a level different to that of its preceding or succeeding signal, i.e., the discriminative signal V5a, V5b in this example, so that its response signal I6a, I6b is distinguishable from the response signal (I5a, I5b) of the discriminative signal (V5a, V5b).

FIGS. 5a and 5b show waveforms of response signal series obtained by applying the detection signals of FIGS. 3a and 3b, respectively, to both channels shown in the connection configuration of FIG. 2. As shown, the two channels D1/D2 and D3/D4 are respectively connected to different consumers 20A, 20B and the current values of the response signals are measured after applying a detection voltage signal series of −4V and −8V. Under this configuration the current does not shunt, therefore the current value of the measured response signals does not drop, as is shown in FIGS. 4a, 4b. In addition, each signal in the response signal series exhibits a level corresponding to the level of the respective detection signals, either the basic detection signal or the discriminative signal. As the level of the discriminative signal V5a applied to the first channel (FIG. 5a) differs from that of the discriminative signal V5b applied to the second channel (FIG. 5b), the response signals obtained at time T6 exhibit different levels in correspondence with the detection signals applied. Nevertheless, if the sixth detection signals (the reference signals V6a, V6b) are included, their response signals I6a, I6b are distinguishable from the response signals I5a, I5b of the discriminative signals V5a, V5b.

FIGS. 6a and 6b show waveforms of response signal series obtained by applying the detection signals of FIGS. 3a and 3b, respectively, to two channels, wherein the first channel is connected by one powered device (FIG. 6a) and the second is not connected by a powered device (FIG. 6b). As shown, since the second channel is not connected by a powered device, the level of the response signal obtained therefrom after applying the detection signal is 0 (0 A). On the other hand, the current values of the response signals are measured at the first channel after applying a detection voltage signal series of −4V and −8V. In the first channel, each signal in the response signal series exhibits a level corresponding to the level of the respective detection signals, either the basic detection signal or the discriminative signal. In addition, if a sixth detection signal (the reference signal V6a) is included, its response signals I6a would be are distinguishable from the response signal I5a of the discriminative signal V5a.

As can be seen from the results shown in FIGS. 6a and 6b, in the connection configuration in which the second channel is connected to an electrical device and the first channel is not connected to the consumer, the waveform of the response signal series obtained after applying the detection signal series of FIGS. 3a and 3b in the respective channels would be the same as those shown in FIGS. 6a and 6b, but they should be opposite. In addition, if none of the two channels is connected to a powered device, the response signal should be 0 level.

FIG. 7 is a block diagram showing an embodiment of the device for detecting powered devices connected to a power source equipment in a Power over Ethernet system according to the present invention. As shown in the figure, the invented detection device 10 is installed in a power source equipment 100 of an Ethernet network power supply system. The power source equipment 100 and a host computer 200 form a power supply system in the Power over Ethernet system and transfer the power supplied by the host computer 200 via the network line 201 to the powered devices 21, 22, 23. As shown in FIG. 7, the electric power (and electric signals) supplied from the host computer 200 enters the interface 101 of the power source equipment 100 via the network line 201 and enters the detection device 10. The power source equipment 100 also provides a plurality of ports 11, 12, 13, 14 for connection of the external devices 21, 22, 23 via network lines 21A, 22A, 23A. The figure shows four ports, but those having ordinary skills in the art will appreciate that the number of ports is not any technical limitations. Typically, the power source equipment 100 may provide eight ports, but any number higher or lower than that is permissible. Three external devices 21, 22, 23 are shown connected to ports 11, 12 and 14, whole port 13 does not have an external device connected. The external devices 21, 22, and 23 may be any of the low power consumption device, medium power consumption device and high power consumption device, or an electric apparatus incompatible with the IEEE standards. The power source equipment 100 functions as a means for transferring the power supplied from the host computer 200 to one or more of the external devices 21, 22, 23 that is suited for supplying power.

A Power over Ethernet system having the above-described configuration is well known in the art and is described in various technical documents including the above-mentioned IEEE 802.3af and IEEE 802.3at standards. Details thereof is thus omitted.

The device for detecting powered devices connected to a power source equipment in a Power over Ethernet system, as provided by the present invention, is used in a power source equipment of a Power over Ethernet system having a plurality of signal/power channels. In such an equipment, each of the signal lines 11A, 12A, 13A, 14A includes two signal/power channels. More specifically, each of the signal lines 11A, 12A, 13A, 14A includes at least two pairs of twisted pairs, preferably four pairs of twisted pairs, used to transfer electrical signals and electrical power. The signal lines 11A, 12A, 13A, 14A extend to contacts (ports) 11, 12, 13, preferably signal connectors, more preferably Ethernet network signal jacks. Of course, the number of the twisted pairs contained in the signal line is not any technical limitations, as long as each signal line includes at least two pairs of signal lines. In the case of four pairs, Category 5e (CAT 5e) and Category 6 (CAT 6) cables, as specified in the existing ANSI/TIA/EIA-568-A standard, are available.

The individual external devices 21, 22, 23 are connected to the power source equipment 100 in the configuration shown in FIGS. 1, 2. In FIG. 1, the power source equipment 100 is connected to one powered device 20 via four pairs of twisted pairs D1, D2, D3, D4, namely, first and second channels. The powered device 20 may be any one of the external devices 21, 22, and 23. After it is determined as a device suitable for supplying power, preferably a powered device conforming to the POE Standard, it is deemed a qualified powered device. In FIG. 2, two power powered devices 20A, 20B are connected to the power source equipment 100 via two pairs of twisted pairs D1, D2 (first channel) and D3, D4 (second channel), respectively.

The method for detecting powered devices connected to a power source equipment in a Power over Ethernet system of the present invention will be described below. FIG. 8 is a flowchart of one embodiment of the invented method for detecting powered devices connected to a power source equipment in a Power over Ethernet system. As shown, the method steps begin at 700. In step 701, the detection device 10 applies a detection signal to the two channels. Each detection signals includes a detection signal series, which includes a plurality of basic detection signals and a discriminative signal, respectively. They are, the first detection signal V1a, V1b, the second detection signal V2a, V2b, the third detection signal V3a, V3b and the fourth detection signal V4a, V4b, all as the basic detection signals, and the fifth detection signal V5a, V5b as the discriminative signal. The detection signal series may further include a sixth detection signal V6a, V6b as a reference signal. The features of the respective detection signals have been described in details in the above description with reference to FIGS. 3a and 3b.

In step 702, the detection device 10 samples response signals from the two channels. Each response signal also includes a response signal series, including a first response signal I1a, I1b responding the first detection signal V1a, V1b, a second response signal I2a, I2b responding the second detection signal V2a, V2b, a third response signal I3a, I3b responding the third detection signal V3a, V3b, a fourth response signal I4a, I4b responding the fourth detection signal V4a, V4b and a fifth response signal I5a, I5b responding the fifth detection signal V5a, V5b. If the detection signal series includes a sixth detection signal V6a, V6b, the response signal series also includes a sixth response signal I6a, I6b. The characteristics of the response signal have been described in details in the foregoing description with reference to FIGS. 4a, 4b, 5a, 5b, 6a, 6b.

In step 703, the detection device 10 determines whether or not all of the response signals are valid signals with a value within a valid range. In general, if the response signal is a current signal, its current value should be between within 50 uA and 750 uA, as previously described. If the result of the determination is NO, it means that the signals as sampled are invalid, and at step 710, it is determined that the test has failed and a new detection cycle is necessary. Otherwise, at step 704, the detection device 10 determines whether or not in the two response signal series, the response signals of the discriminative signal exhibit a distinctive characteristic. For example, if one of the response signals is at a 0 level, while the other is not, the two response signals are distinctive. In addition, the detection device 10 also determines whether or not in the response signal series including the response signal with a non 0 level, the level of the response signals responding the basic detection signals is about half the value of the response signal responding the discriminative signal, to determine whether the current has shunt, as described above. In practice, the detection device 10 may determine whether I5a=I3a+I3b is true, or (I5a=I3a+I3b and I5b=0) are true. If the result of the determination is YES, it is initially determined that the connection configuration of the power source equipment 100 is one powered device being connected to the power source equipment 100 via two channels. Thereafter, in step 705 the detection device 10 detects the resistance value of the two channels and determines whether the value is within an effective range, i.e., whether or not the resistance value is the aforementioned signature resistance. In a preferred embodiment of the present invention, in case a power source equipment is connected to a powered device via two channels, the sum of the current values of the two channels can be used to calculate the resistance value. That is, let V1t=V1a or V1b, V2t=V2a or V2b, V3t=V3a or V3b, V4t=V4a or V4b, I1t=I1a+I1b, I2t=I2a+I2b, I3t=I3a+I3b, I4t=I4a+I4b. Calculate the values of Rdet1t=(V1t−V2t)/(I1t−I2t) and Rdet2t=(V3t−V4t)/(I3t−I4t). Determine whether the value of Rdet1t and Rdet2t falls within the range of 17 k and 29.5 k ohm, i.e., 17 k<Rdet1t, Rdet2t<29.5 k ohm. If the result is positive, it is confirmed that the connection configuration is one powered device 20 being connected to the power source equipment 10. In step 706 the powered device 20 is further classified then power allocation and power supply are managed accordingly. In such a case, power is supplied via the two channels to one powered device, usually a high power consumption device, or a medium power consumption device in some cases. It is important to note that, in this power supplying mode, the power source equipment needs to combine the currents of the two channels for further power management. In this step, the detection device 10 may further determine whether or not Rdet1t=Rdet2t is satisfied, in order to improve the accuracy of the detection. If the determination in step 705 results at negative, i.e., Rdet1t≠Rdet2t, the detection is determined failure in step 710.

If the result of the determination in step 704 is NO, it can be determined that no electrical equipment is connected to the power source equipment 100 via the two channels. In this case, the detection device 10 further determines the connection configurations as follows: In step 707 the detection device 10 determines whether or not (1) Rdet1a=Rdet2a and whether or not (2) Rdet1b=Rdet2b, wherein Rdet1a=(V1a−V2a)/(I1a−I2a), Rdet2a=(V3a−V4a)/(I3a−I4a), Rdet1b=(V1b−V2b)/(I1b−I2b) and Rdet2b=(V3b−V4b)/(I3b−I4b).

1. If the result of the determination is YES in (1) and YES in (2), it is determined that two separate powered devices are connected to the power source equipment 100 via one of the two channels, respectively.

2. If the result of the judgment is NO in (1) and YES in (2), it is determined that the first channel is not connected to a powered device, and the second channel is connected to a powered device.

3. If the result of the judgment is YES in (1) and NO in (2), it is determined that the first channel is connected to one powered device and the second channel is not connected to a powered device.

4. If the result of the judgment is NO for both (1) and (2), it is determined that neither of the two channels is connected to a powered device.

Based on the above determinations, the detection device 10 continues to determine in step 708 whether the resistance value of the channels to which a powered device is connected is within the effective range, i.e., a signature resistance. In practice, the detection device determines whether the value of Rdet1a, Rdet2a, Rdet1b, or Rdet2b is within the range of 17 k and 29.5 kohm. If the result of the determination is YES, in the following step 709 the detection device 10 sequentially or simultaneously classifies the powered devices 20A, 20B, followed by the managements in power allocation and power supply. In this case, the powered devices 20A or 20B may be respectively a medium or low power consumption device. In addition, the manufacturer or user may also attempt to combine powered devices 20A and 20B in order to support a higher power consumption. When the result of the determination in step 709 is NO, the test is determined failed in step 710. Here, the power supply of step 709 is substantially the same as the power supply of step 706. But in step 706, values of the current and the supplied power of the two channels are calculated and managed as a whole, while in step 709, the currents of the two channels are calculated and managed in terms of the supplied power.

As described above, the device for detecting powered devices connected to a power source equipment in a Power over Ethernet system of the present invention applies a discriminative detection signal, when the connection configuration of the powered devices are detected. Because of the discriminative signal, the response signals from the powered device(s) via the two channels exhibit distinctive features, whereby correct detection in the connection configurations may be achieved. The discriminative signal can be directly added to a conventional detection signal, can be easily detected by a conventional detection device, and can provide sufficient information for correct determinations. Compared with other known techniques, the invented detection mechanism is simplified and effective.

The foregoing is a description of some embodiments of the method and device for detecting powered devices connected to a power source equipment in a Power over Ethernet system. It will be appreciated by those skilled in the art that embodiments of the present invention may be modified with known techniques to achieve the same or similar effects. Therefore, these modifications are within the scope of the present invention.

For example, in FIG. 8, if the result of determination is NO, i.e., not all the response signals are within the valid range, the step may not necessarily proceed to step 710 to announce failure. Rather, a further determination of whether or not the response signal obtained in one of the two channels is within the valid range? If the result is YES, the method proceeds to step 707; otherwise, step 710.

What is claimed is:

1. A device for detecting powered devices connected to a power source equipment (PSE) in a Power over Ethernet (POE) system, to be installed in the power source equipment comprising at least two signal/power channels to be connected by the powered devices for supplying power to the powered devices, wherein the detection device connects the two signal/power channels and is configured to apply to each channel a series of detection signals including a plurality of basic detection signals and at least one discriminative signal; wherein a detection signal series A applied to a first channel and a detection signal series B applied to a second channel have the same number and level of the basic detection signals and the same number but different levels of discriminative signals; and wherein the detection device is further configured to:
 detect a response signal series A from the first channel and a response signal series B from the second channel after a predetermined time following the detection signal series;
 determine whether the first channel and the second channel are connected to the same powered device, according to response signals in the response signal series A and B in response to the discriminative signals, respectively;
 when a result of the preceding determination is negative, calculate a resistance value according to the response signal series A and the response signal series B and to determine whether the two channels are connected to two powered devices or are connected to no powered device, or only one channel is connected to one powered device; and
 supply power to a powered device determined to be in connection with the power source equipment, and
wherein the basic detection signals of the respective detection signal series include in sequence a first detection signal V1a, V1b, a second detection signal V2a, V2b, a third detection signal V3a, V3b and a fourth Detection signals V4a, V4b and the discriminative signal includes a fifth detection signal V5a, V5b, wherein in the detection signal series A applied to the first channel levels of the first and third detection signals V1a and V3a are substantially the same and levels of the second and fourth detection signals V2a and V4a are substantially the same; in the detection signal series B applied to the second channel, levels of the first and third detection signals V1b and V3b are substantially the same and levels of the second and fourth detection signals V2b and V4b are substantially the same; and in one detection signal series, a level of the fifth detection signal V5a is substantially the same as that of the first and third detection signals V1a and V3a or V1b and V3b, or as that of the second and fourth detection signals V2a and V4a or V2b and V4b and in the other detection signal series a level of the fifth detection signal is the contrary.

2. The device according to claim 1, wherein the discriminative signal is generated after the basic detection signals.

3. The device according to claim 1, wherein the discriminative signal is generated before the basic detection signals, or at least a part thereof.

4. The device according to claim 1, wherein the detection signal series further comprises a sixth detection signal V6a, V6b for generating a reference response signal.

5. The device according to claim 1, wherein the detection device determines both the first channel and the second channel are connected to a same powered device, when the following conditions are satisfied:
 (1) in one response signal series a response signal responding the discriminative signal is substantially 0 level and in the other response signal series a response signal responding the discriminative signal is non-zero; and
 (2) a level of the non-zero response signal corresponds to a sum of level of two response signals at an identical sequential position in the respective response signal series.

6. The device according to claim 1, wherein the detection signals are a voltage signal and the response signals are a current signal.

7. The device according to claim 1, wherein the detection signals are a current signal and the response signals are a voltage signal.

8. The device according to claim 1, wherein the detection signals are a voltage signal and the response signals are a current signal and wherein each of the response signal series detected from the first and second channels, respectively, includes in sequence a first response signal I1a, I1b responsive to the first detection signal V1a, V1b, a second response signals I2a, I2b responsive to the second detection signal V2a, V2b, a third response signal I3a, I3b responsive to the third detection signal V3a, V3b, a fourth response signal I4a, I4b responsive to the fourth detection signal V4a, V4b, and a fifth response signal I5a, I5b responsive to the fifth detection signal V5a, V5b; wherein the detection device is further configured to:
 (1) determine the two channels are connected to one same powered device, if I5a=I1a+I1b and I5b=0; otherwise,
 (2) determine the two channel are respectively connected to two powered devices, if Rdet1a=Rdet2a and Rdet1b=Rdet2b,
 (3) determine the first channel is connected to one powered device and the second channel is not connected to a powered device, if Rdet1a=Rdet2a and Rdet1b≠Rdet2b, and
 (4) determine the second channel is connected to one powered device and the first channel is not connected to a powered device, if Rdet1a≠Rdet2a and Rdet1b=Rdet2b; otherwise,
 (5) determine no powered device is connected to the first or the second channel; wherein Rdet1a=(V1a−V2a)/(I1a−I2a), Rdet2a=(V3a−V4a)/(I3a−I4a), Rdet1b=(V1b−V2b)/(I1b−I2b) and Rdet2b=(V3b−V4b)/(I3b−I4b).

9. The device according to claim 8, wherein the detection device is configured to determine a channel is not connected to any powered device and no power shall be supplied thereto, if a Rdet1a, Rdet2a, Rdet1b, and Rdet2b corresponding to the channel exceeds a predetermined value range.

10. The device according to claim 8, wherein the detection device is further configured to determine, after the detection device has determined the two channels are connected to one same powered device, whether a value of Rdet1t and Rdet2t falls within a predetermined range, and supply power to the first channel and the second channel only when a result of said determination is YES; wherein Rdet1$t$=(V1$t$−V2$t$)/(I1$t$−I2$t$) and Rdet2$t$=(V3$t$−v4$t$)/(I3$t$−I4$t$), V1$t$=V1$a$ or V1$b$, V2$t$=V2$a$ or V2$b$, V3$t$=V3$a$ or V3$b$, V4$t$=V4$a$ or V4$b$, I1$t$=I1$a$+I1$b$, I2$t$=I2$a$+I2$b$, I3$t$=I3$a$+I3$b$ and I4$t$=I4$a$+I4$b$.

11. The device according to claim 10, wherein the predetermined range is between 17 k ohms and 29.5 k ohms.

12. The device according to claim 1, wherein a duration of the fourth detection signal is a sum of a duration of the second detection signal and an extension time.

13. The device according to claim 12, wherein n the extension time is 0.2 to 1.5 times of the second detection signal.

14. The device according to claim 12, wherein n the extension time is 0.5 to 1.0 times of the second detection signal.

15. The device according to claim 1, wherein each signal/power channel is connected to a contact, which is an Ethernet signal line jack.

16. A method for detecting powered devices connected to a power source equipment in a Power over Ethernet system, to detect and determine a connection configuration of the powered device and the power source equipment, so to supply power to the detected powered device(s), wherein the power source equipment comprises at least two signal/power channels to be connected the powered devices for supplying power to the powered devices; the method comprising the steps of:
applying to each channel a series of detection signals including a plurality of basic detection signals and at least one discriminative signal; wherein a detection signal series A applied to a first channel and a detection signal series B applied to a second channel have the same number and level of the basic detection signals and the same number but different levels of discriminative signals; and
detecting a response signal series A from the first channel and a response signal series B from the second channel after a predetermined time following the detection signal series;
determine whether the first channel and the second channel are connected to the same powered device, according to response signals in the response signal series A and B in response to the discriminative signals, respectively;
when a result of the preceding determination is negative, calculating a resistance value according to the response signal series A and the response signal series B and to determine whether the two channels are connected to two powered devices or are connected to no powered device, or only one channel is connected to one powered device; and
supplying power to a powered device determined to be in connection with the power source equipment,
wherein the basic detection signals of the respective detection signal series include in sequence a first detection signal V1$a$, V1$b$, a second detection signal V2$a$, V2$b$, a third detection signal V3$a$, V3$b$ and a fourth Detection signals V4$a$, V4$b$ and the discriminative signal includes a fifth detection signal V5$a$, V5$b$, wherein in the detection signal series A applied to the first channel levels of the first and third detection signals V1$a$ and V3$a$ are substantially the same and levels of the second and fourth detection signals V2$a$ and V4$a$ are substantially the same; in the detection signal series B applied to the second channel, levels of the first and third detection signals V1$b$ and V3$b$ are substantially the same and levels of the second and fourth detection signals V2$b$ and V4$b$ are substantially the same; and in one detection signal series a level of the fifth detection signal V5$a$ is substantially the same as that of the first and third detection signals V1$a$ and V3$a$ or V1$b$ and V3$b$, or as that of the second and fourth detection signals V2$a$ and V4$a$ or V2$b$ and V4$b$ and in the other detection signal series a level of the fifth detection signal is the contrary.

17. The method according to claim 16, wherein the discriminative signal is generated after the basic detection signals.

18. The method according to claim 16, wherein the discriminative signal is generated before the basic detection signals, or at least a part thereof.

19. The method according to claim 16, wherein the detection signal series further comprises a sixth detection signal V6$a$, V6$b$ for generating a reference response signal.

20. The method according to claim 16, wherein the detection device determines both the first channel and the second channel are connected to a same powered device, when the following conditions are satisfied:
(1) in one response signal series a response signal responding the discriminative signal is substantially 0 level and in the other response signal series a response signal responding the discriminative signal is non-zero; and
(2) a level of the non-zero response signal corresponds to a sum of level of two response signals at an identical sequential position in the respective response signal series.

21. The method according to claim 16, wherein the detection signals are a voltage signal and the response signals are a current signal.

22. The method according to claim 16, wherein the detection signals are a current signal and the response signals are a voltage signal.

23. The method according to claim 16, wherein the detection signals are a voltage signal and the response signals are a current signal and wherein each of the response signal series detected from the first and second channels, respectively, includes in sequence a first response signal I1$a$, I1$b$ responsive to the first detection signal V1$a$, V1$b$, a second response signals I2$a$, I2$b$ responsive to the second detection signal V2$a$, V2$b$, a third response signal I3$a$, I3$b$ responsive to the third detection signal V3$a$, V3$b$, a fourth response signal I4$a$, I4$b$ responsive to the fourth detection signal V4$a$, V4$b$, and a fifth response signal I5$a$, I5$b$ responsive to the fifth detection signal V5$a$, V5$b$;
wherein the step of determining whether the two channels are connected to one same powered device comprises the step of:
(1) determining the two channels are connected to one same powered device, if I5$a$=I1$a$+I1$b$ and I5$b$=0; otherwise,
and wherein the steps of determining whether the two channels are connected to two powered devices or are connected to no powered device, or only one channel is connected to one powered device comprise the steps of;
(2) determining the two channel are respectively connected to two powered devices, if Rdet1$a$=Rdet2$a$ and Rdet1$b$=Rdet2$b$,
(3) determining the first channel is connected to one powered device and the second channel is not connected to a powered device, if Rdet1$a$=Rdet2$a$ and Rdet1$b$≠Rdet2$b$, and (4) determining the second channel is connected to one powered device and the first channel is not connected to a powered device, if Rdet1a≠Rdet2a and Rdet1b=Rdet2b; otherwise, (5) determining no powered device is connected to the first or the second channel; wherein Rdet1a=(V1a−V2a)/(I1a−I2a), Rdet2a=(V3a−V4a)/(I3a−I4a), Rdet1b=(V1b−V2b)/(I1b−I2b) and Rdet2b=(V3b−V4b)/(I3b−I4b).

24. The method according to claim 23, further comprising a step of determining a channel is not connected to any powered device and no power shall be supplied thereto, if a Rdet1a, Rdet2a, Rdet1b, and Rdet2b corresponding to the channel exceeds a predetermined value range.

25. The method according to claim 23, further comprising a step of determining, after the detection device has determined the two channels are connected to one same powered device, whether a value of Rdet1t and Rdet2t falls within a predetermined range, and a step of supplying power to the first channel and the second channel only when a result of said determination is YES; wherein Rdet1t=(V1t−V2t)/(I1t−I2t) and Rdet2t=(V3t−v4t)/(I3t−I4t), V1t=V1a or V1b, V2t=V2a or V2b, V3t=V3a or V3b, V4t=V4a or V4b, I1t=I1a+I1b, I2t=I2a+I2b, I3t=I3a+I3b and I4t=I4a+I4b.

26. The method according to claim 24, wherein the predetermined range is between 17 k ohms and 29.5 k ohms.

27. The method according to claim 16, wherein a duration of the fourth detection signal is a sum of a duration of the second detection signal and an extension time.

28. The method according to claim 27, wherein n the extension time is 0.2 to 1.5 times of the second detection signal.

29. The method according to claim 28, wherein n the extension time is 0.5 to 1.0 times of the second detection signal.

* * * * *